US012736723B2

(12) United States Patent
Urbanski et al.

(10) Patent No.: US 12,736,723 B2
(45) Date of Patent: Sep. 15, 2026

(54) METHOD FOR CREATING SURFACE MICROSTRUCTURES

(71) Applicant: ROLIC TECHNOLOGIES AG, Allschwil (CH)

(72) Inventors: Martin Urbanski, Bruchsal (DE); Hans Leonhard Prechtel, Basel (CH)

(73) Assignee: ROLIC TECHNOLOGIES AG, Allschwil (CH)

( * ) Notice: Subject to any disclaimer, the term of this patent is extended or adjusted under 35 U.S.C. 154(b) by 399 days.

(21) Appl. No.: 18/286,017

(22) PCT Filed: Apr. 29, 2022

(86) PCT No.: PCT/EP2022/061472
§ 371 (c)(1),
(2) Date: Oct. 6, 2023

(87) PCT Pub. No.: WO2022/238146
PCT Pub. Date: Nov. 17, 2022

(65) Prior Publication Data

US 2025/0004183 A1 Jan. 2, 2025

(30) Foreign Application Priority Data

May 12, 2021 (EP) .................................... 21173600

(51) Int. Cl.
*G02B 5/18* (2006.01)
*B81C 1/00* (2006.01)

(52) U.S. Cl.
CPC ........ *G02B 5/1847* (2013.01); *B81C 1/00103* (2013.01); *B81C 1/00206* (2013.01); *B81C 1/00373* (2013.01)

(58) Field of Classification Search
CPC .............. G02B 5/1847; B81C 1/00103; B81C 1/00206; B81C 1/00373; B44C 1/00; B44C 1/24
See application file for complete search history.

(56) References Cited

U.S. PATENT DOCUMENTS

| | | | | |
|---|---|---|---|---|
| 2007/0196616 | A1 | 8/2007 | Stalder et al. | |
| 2009/0179418 | A1* | 7/2009 | Stalder ............. | B29D 11/00865 283/85 |
| 2012/0027998 | A1* | 2/2012 | Ibn-Elhaj ................. | C25D 1/00 264/293 |
| 2012/0255073 | A1 | 10/2012 | Despont et al. | |
| 2018/0015771 | A1* | 1/2018 | Tompkin .............. | G02B 5/1861 |
| 2018/0106932 | A1* | 4/2018 | Schill ................... | G02B 5/0257 |
| 2020/0215839 | A1 | 7/2020 | Tompkin et al. | |

FOREIGN PATENT DOCUMENTS

| | | | |
|---|---|---|---|
| JP | 2014-209202 | A | 11/2014 |
| JP | 2015-63039 | A | 4/2015 |
| KR | 10-2007-0043797 | A | 4/2007 |
| WO | 01/29148 | A1 | 4/2001 |
| WO | 2010/094441 | A1 | 8/2010 |

OTHER PUBLICATIONS

Fast & precise non-contact 3D measurement of surface details—What would Mr. Lincoln say?, Novacam (Oct. 28, 2021), https://www.novacam.com/2021/10/28/fast-and-precise-non-contact-3d-measurements-of-surface-details/ (Year: 2021).*

International Search Report for PCT/EP2022/061472 dated Oct. 13, 2022.

Written Opinion PCT/EP2022/061472 dated Oct. 13, 2022.

Communication dated Apr. 9, 2026, in Korean Application No. 10-2023-7041714.

* cited by examiner

*Primary Examiner* — William P Fletcher, III
(74) *Attorney, Agent, or Firm* — Sughrue Mion, PLLC

(57) ABSTRACT

A method for creating a desired surface microstructure includes first providing an original microstructured surface having a structure depth between 10 nm and 100 μm. The topography of this original microstructure is digitally acquired using a 3D surface profilometer and processed into structure-describing data suitable for a writing tool. The processed data may include lateral scaling, anisotropic or non-periodic features, binarization, or composition from distinct basic microstructure elements. The writing tool then applies this data to a target material, optionally in a resin, to produce a desired microstructure with modifiable depth and surface microstructure aspect ratio. The method enables precise fabrication of optically effective regions or regions optimized for liquid-crystal alignment.

25 Claims, 9 Drawing Sheets

METHOD FOR CREATING SURFACE MICROSTRUCTURES

This Application is a National Stage of International Application No. PCT/EP2022/061472 filed Apr. 29, 2022, claiming priority based on European Patent Application Ser. No. 21/173,600.4 filed May 12, 2021.

TECHNICAL FIELD

The invention relates to a method for manufacturing surface microstructures including the adaption of the microstructure parameters of available surface microstructures to the requirements of a variety of applications.

BACKGROUND OF THE INVENTION

The surface of a material determines how the material interacts with the environment. For example, the surface of a material is the interface to other materials, such as gases, liquids and solids. Parameters which describe some of the surface properties are, for example, the surface tension, the friction or the adhesion. Depending on the application, each of these parameters may be desired to be anywhere between high and low. The surface of a material also determines the interaction with light, such as reflection and scattering.

While material properties, such as the refractive index or the polarity of the material strongly contribute to some of the above parameters, the surface texture has a big impact on these parameters as well. For example, the surface roughness has strong influence on friction and light scattering properties. Technologies, which can change the surface topography of a solid material, have become very important for many applications in different industrial fields. For example, there are technologies, which can create anisotropic surface microstructures on the surface of an isotropic material, which provide alignment capabilities for liquid crystals. Light scattering anisotropic surface microstructures are, for example, used as security features in optical security elements.

The dimensions of the surface microstructures are important. For example, if size and spacing of microstructure elements is in the same order as the wavelength of light to which the microstructure is exposed, light scattering may occur. If, on the other hand, the structure dimensions are well below the wavelength of the light, scattering does not occur, but the effective index of refraction may be reduced at the surface compared to the refractive index in the bulk of the material. Surfaces with such microstructures can therefore be used for antireflection purposes.

In some of the above-mentioned technologies, the desired structures are designed with the help of computer programs and are then transferred into the surface of a material, for example using ablation or lithographic techniques. The dimension of such deterministic structures can be freely selected. Other technologies, which are for example based on self-organizing mechanisms, provide non-deterministic surface microstructures. In contrast to the computer designed deterministic structures, which can be freely scaled, the structure dimensions of such non-deterministic structures are determined by process conditions as well as material properties. By changing process parameters and material properties, the structure dimensions may be varied, but typically only within a limited range. Moreover, the area on which such surface microstructures can be produced may be limited.

It would, therefore, be desirable to have methods available which can create surface microstructures that are not accessible with current available technologies and which can be economically produced on larger areas.

WO 01/29148 A1 discloses a method for producing polymer films or coatings with surface microstructures, which is based on phase separation of materials. In the method, which is known as monomer corrugation (MC) technology, a material composition comprising crosslinkable and non-crosslinkable substances is applied as a layer on a substrate. Upon irradiation of the layer with uv-light, the cross-linkable substances begin to crosslink and phase separation of crosslinked and non-cross-linked substances starts to develop. By removal of the non-crosslinked substances an MC-layer exhibiting a surface microstructure is obtained. The dimensions of the surface structure can be controlled by the type and the percentage of the substances in the composition as well as by process parameters such as temperature, uv-dose and process duration. The surface microstructure may be isotropic or anisotropic. Anisotropic surface microstructures can be achieved if the crosslinkable material in the composition is a liquid crystalline substance. The anisotropy direction can be defined by an alignment layer beneath a layer formed from the composition. By using an alignment layer providing an orientation pattern, a pattern with different anisotropy directions may be generated in the MC-layer. MC-layers can, for example, be applied as alignment layers for liquid crystals, optical retardation layers, anti-reflective coatings, and optical diffusers.

SUMMARY OF THE INVENTION

An object of the present invention is to provide methods for producing surface microstructures, in particular non-deterministic surface microstructures, which are not accessible with current available technologies and which can be economically produced on larger areas.

The invention provides a method for creation of a desired surface microstructure, which comprises the steps

- providing a material with a surface microstructure which has a topography, the surface microstructure being considered as the original surface microstructure
- providing a 3D surface profilometer
- acquiring digital data of the original surface microstructure topography with the 3D surface profilometer;
- providing a writing tool;
- processing the digital data of the original surface microstructure topography to obtain structure describing data to be written by the writing tool;
- providing the structure describing data for a desired surface microstructure to the writing tool;
- providing a target material;
- optionally providing a resin;
- creating the desired surface microstructure in or on the target material comprising writing with the writing tool a structure in or on the target material or in a resin using the structure describing data.

In the context of the present application, a "surface microstructure" is relief microstructure at the surface of a material and therefore has a three dimensional topography.

The term "original surface microstructure" refers to the surface structure of which digital data is acquired by the 3D surface profilometer.

In the context of the present application, the term "3D surface profilometer" shall include any tool that can provide digital data of a surface microstructure topography. Suitable 3D surface profilometers use techniques such as, for example, atomic force microscopy (AFM), scanning tunneling microscopy (STM), scanning electron microscopy (SEM), white-light interferometry, optical microscopy, confocal microscopy, hyperfocal imaging, or laser scanning.

In the context of the present application a "writing tool" shall include any tool that can create or define a microstructure in or with another material provided that it has the proper resolution for writing the desired surface microstructure. A first suitable type of writing tool adds a material in the form of the desired surface microstructure on top of a surface of the target material, such as printing, including, but not limited to jet printing and 3D-printing, in particular high resolution printing. Another suitable type of writing tool removes material from the surface of the target material, such as by laser ablation, preferably pulsed laser ablation, e-beam or ion-beam writing. Preferred types of writing tools are those which are used in lithographic processes, such as photo- or e-beam lithography, in which light or electron beams selectively irradiate a resin, which causes a change of solubility in the irradiated areas of the resin. Contrary to the writing tools described above, which directly create a surface microstructure by adding or removing material, the writing tools used in lithography only create a latent microstructure with the spatial form of the desired surface microstructure. A surface microstructure is then created in the resin by developing in a proper solvent. The surface microstructure created in the resin may already be the desired surface microstructure. Preferably, however, the resin is applied as a layer on top of the target material and the microstructure created in the resin is further transferred into the target material by dry or wet etching, thereby forming the desired surface microstructure. Alternatively, the resin is applied as a layer on top of a photomask material and a photomask with the microstructure written in the resin is manufactured, the photomask then being used in additional photolithographic steps to create the desired surface microstructure in the target material. Suitable writing tools for lithography are electron beam lithography (EBL) systems or laser scanning tools. Preferably, the writing tool has the option to rescale the lateral dimensions of the structure to be written. If the writing tool is used to rescale the lateral dimensions of the structure to be written, at least part of processing of the digital data is done by the writing tool.

In principle, any kind of material can be used as the target material, such as glass, plastic, metal, ceramics, silicon, fused silica or a resin. Preferably, the target material is suitable for anisotropic etching. Preferably, the target material is a silicon wafer or a metal layer on a substrate, such as a glass substrate. Preferred metals are aluminum, silver, chromium, and copper. Preferably, the target material has a flat surface.

Processing the digital data of the original surface microstructure topography may include converting the digital data into a format that can be read by the writing tool.

The digital data of the original surface microstructure that have been acquired by the 3D surface profilometer, can be further processed, for example by lateral scaling to change the lateral dimensions of the microstructure. This allows, for example, to adjust the dimensions of the microstructure for the desired interaction with light. For example, if an original surface microstructure provides optimum light scattering properties for visible light, the digital data of the original surface microstructure can be scaled such that the desired surface microstructure that is created in the target material provides optimum scattering for light of shorter wavelengths, for example for ultra violet (uv)-light, or for light of longer wavelengths, for example for infrared (IR)-light. It is also possible to apply anisotropic scaling by applying different scaling factors in different lateral directions, preferably in two different directions, which are perpendicular to each other. Anisotropic scaling changes the anisotropic properties of the surface structure. For example, an anisotropic structure can be generated from an original surface microstructure which is isotropic. On the other hand, the anisotropy of microstructures can be enhanced by applying a larger scaling factor along the anisotropy direction than perpendicular to it, for example to provide increased alignment forces for liquid crystals to be aligned by such surface microstructures. Standard graphical image manipulation computer programs may be used for processing.

Preferably, processing of the digital data includes vectorization of the data.

Preferably, processing of the digital data includes binarization of the surface microstructure topography, which removes the variation of depth. Even the value of the structure depth might not be of interest if it is desired to adjust the depth during manufacturing of the desired surface microstructure by controlling the process parameters. Accordingly, binarization reduces the electronic data to a 2-dimensional description of a microstructure. The binarized data may be normalized, such that, for example, at any lateral position the data is either 0 or 1. In the following, the two levels 0 or 1 are also referred to as bottom or top, respectively. Accordingly, lateral regions in which every lateral position is assigned as 1 are referred to as top regions, and regions in which every lateral position is assigned as 0 are referred to as bottom regions. Depending on the original surface microstructure and on the applied binarization algorithm, artefacts in the binarized data may occur, which, for example show up as very small top or bottom regions. Such artefacts may be removed by applying filters, such as noise filters, smoothing or other filters, which are also available in some graphical image manipulation programs. Processing may further include manual manipulation of the binarized microstructure using suitable computer programs.

There are original surface microstructures, which only have two plateaus, a top plateau and a bottom plateau. Such surface microstructures are already binary and binarization of the acquired data may not be required. In accordance with the above definition, regions belonging to the top plateau are referred to as top region and regions belonging to the bottom plateau are referred to as bottom region.

The topography of a surface microstructure may be quite complex, in particular if it looks like a landscape with "hills" and "valleys" of different heights and continuous height variations. Like in a real landscape, there may be valleys between larger hills that are at a higher height level than the top of some smaller hills. Ambiguous identification of structure elements might, therefore, not always be possible. For the purpose of describing the lateral dimensions of a surface microstructure topography, a cross-section of the surface microstructure topography at a height of 50% of the structure depth above the lower height level shall be used. The structure depth and the lower height level may be different in different regions of a surface microstructure. Therefore, if only a certain region of a larger area comprising a surface microstructure is considered, then the structure depth and the lower height level of the considered region shall apply for evaluation of the surface microstructure cross-section. Similar to binarization of the digital data, which is described in more detail further below, the regions of the microstructure that are cut by the cross-section are then assigned as top regions of the surface microstructure, whereas the other regions are referred to as bottom regions.

As mentioned above, the assignment of top and bottom regions to a surface microstructure as a result of a cross-section is only made to provide an unambiguous identification of microstructure elements. However, it does not necessarily mean that the digital data of the surface microstructure have been binarized. Especially, binarization may follow a different algorithm, which is described further below, and which may lead to a different assignment of top and bottom regions. The introduction of the terms top regions and bottom regions for both the surface microstructure topography with continuous height variation and for binarized microstructure data simplifies the characterization of the microstructures and avoids the introduction of additional terms.

In the context of the present application, the "structure depth" of a surface microstructure in a certain area shall be the height difference between the upper height level and the lower height level of the surface microstructure. The "upper height level" shall be the average height of the highest hills in the respective area. To identify the highest hills, the local height maxima of all hills in the respective area are obtained and ranked in the order of their height. The highest hills shall be those 10% of the hills with the highest heights. If there are less than 10 hills in the respective area, then the upper height level of the surface microstructure is the height of the highest hill. Analogously, the "lower height level" of the surface microstructure shall be the average height of the lowest valleys in the respective area. To identify the lowest valleys, the local height minima of all valleys in the respective area are obtained and ranked in the order of their height. The lowest valleys shall be those 10% of the valleys with the lowest heights. If there are less than 10 valleys in the respective area, then the lower height level of the surface microstructure is the height of the lowest valley.

In principle, the original surface microstructure may have any value of structure depth. Preferably, the structure depth of the original surface microstructure is in the range from 10 nm to 100 μm, more preferred in the range from 30 nm to 10 μm and most preferred in the range from 50 nm to 2 μm.

In the context of the present invention the term "average structure width" is the average width of the top regions. For anisotropic surface microstructures the average structure width may be different along different lateral directions.

Preferably, the original surface microstructure comprises an area in which the average structure width, which when the surface microstructure is anisotropic is determined along the direction perpendicular to the anisotropy direction, is in the range from 10 nm to 1 mm, more preferred in the range from 50 nm to 100 μm and most preferred in the range from 100 nm to 10 μm. In case the original surface microstructure is anisotropic, the original surface microstructure preferably comprises an area in which the average structure width along the anisotropy direction is preferably in the range from 50 nm to 5 mm, more preferred in the range from 200 nm to 200 μm and most preferred in the range from 500 nm to 50 μm.

In the context of the present invention the term "average lateral structure distance" is the average distance between adjacent top regions. For anisotropic surface microstructures the average lateral structure distance may be different along different lateral directions.

Preferably, the original surface microstructure comprises an area in which the average lateral structure distance, which when the surface microstructure is anisotropic is determined along the direction perpendicular to the anisotropy direction, is in the range from 10 nm to 1 mm, more preferred in the range from 50 nm to 100 μm and most preferred in the range from 100 nm to 10 μm. In case the original surface microstructure is anisotropic, the original surface microstructure preferably comprises an area in which the average lateral structure distance along the anisotropy direction is preferably in the range from 50 nm to 5 mm, more preferred in the range from 200 nm to 200 μm and most preferred in the range from 500 nm to 50 μm.

In the context of the present invention the term "microstructure fill factor" is defined as the ratio of the total area of top regions to the integrated area over all top and all bottom regions. Preferably, the original surface microstructure has at least one area in which the microstructure fill factor is in the range from 0.050 to 0.95, more preferred in the range from 0.2 to 0.8 and most preferred in the range from 0.3 to 0.7.

Preferably the original surface microstructure is optically effective, which shall mean that incoming light is modulated in a characteristic way, depending on the surface microstructure. More preferably, the interaction with light is such that the light is diffracted, refracted, or scattered.

The original surface microstructure may be isotropic or anisotropic. It is also possible, that in some regions the microstructure is isotropic and in other regions the microstructure is anisotropic. The original surface microstructure may be periodic or non-periodic. It is also possible, that in some regions the microstructure is periodic and in other regions the microstructure is non-periodic.

In the context of the present invention, the term "anisotropy direction" in an anisotropic microstructure shall mean a local symmetry axis within the plane of the microstructure, for example the direction along grooves of a surface microstructure.

The degree of anisotropy may be described by an order parameter.

According to the above, in the context of the present invention, parameters, which may characterize a microstructure, in the following referred to as microstructure parameters, include but are not limited to the average structure width, the average lateral structure distance, the microstructure fill factor, the anisotropy direction, the degree of anisotropy and the structure depth. Depending on the kind of microstructure not all of these microstructure parameters may reasonably by used for its characterization.

In preferred embodiments of the invention, processing includes arranging microstructures multiple times at distinct positions to form larger areas of microstructures. In many computer programs this corresponds to operations such as "copy" and "paste", for example in above mentioned graphical image manipulation computer programs. For that purpose, the full or part of the area of a microstructure may be selected as a "basic microstructure element". If the microstructure within the basic microstructure element is uniform, then by arranging the basic microstructure element multiple times at distinct positions, a large area with a uniform microstructure can be generated. If, on the other hand, the basic microstructure element comprises regions, which differ by one or more of their microstructure parameters, the plurality of the multiply arranged basic microstructure elements form a microstructure on a larger area with a repetition of the different regions of the basic microstructure element. For example, if a basic microstructure element has a rectangular form and is composed of two square areas, both with an anisotropic microstructure, wherein the anisotropy directions in the two areas are perpendicular to each other, then a large area having a microstructure with a checkerboard appearance, in which areas with microstructures of parallel and perpendicular anisotropy directions are alternating in x- and y-direction, can be created by properly arranging the basic microstructure element multiple times in x- and y-direction. Preferably, the shape of the basic structure element is such that the entire large area can be filled with basic structure elements without any gaps. In analogy to computer program language the basic microstructure elements arranged multiple times at different positions are also referred to as "copies" of the basic microstructure element.

In the context of the present application the microstructure that results from multiply arranging basic microstructure elements shall be referred to as a "composed microstructure".

Preferably, one or more of the microstructure parameters of a basic microstructure element is modified by a computer software before or after it is arranged at a certain position as part of a composed microstructure. Modification of the microstructure parameters of a basic microstructure element as well as size and shape of its area may be different for each additional position. A modified basic microstructure element is also considered as a basic microstructure element.

Different basic microstructure elements may be used to design a composed microstructure, which can then be transferred as structure describing data to the writing tool. Preferably, creation of a composed microstructure includes arranging two basic microstructure elements, which differ by the average lateral structure distance of the microstructure and/or which differ by the average structure width of the microstructure and/or which differ by the microstructure fill factor of the microstructure and/or which differ by the anisotropy direction of the microstructure and/or which differ by the degree of anisotropy and/or wherein one basic microstructure element comprises a periodic microstructure and the other basic microstructure element comprises a non-periodic microstructure, and/or wherein one basic microstructure element comprises a deterministic microstructure and the other basic microstructure element comprises a non-deterministic microstructure.

Accordingly, the composed microstructure preferably comprises two zones, which differ by the average lateral structure distance of the microstructure. Preferably, the composed microstructure comprises two zones, which differ by the average structure width of the microstructure. Preferably, the composed microstructure comprises two zones, which differ by the microstructure fill factor of the microstructure. Preferably, the composed microstructure comprises a zone with a periodic microstructure and a zone with a non-periodic microstructure. Preferably, the composed microstructure comprises two zones with an anisotropic microstructure, which differ by the anisotropy direction of the microstructure. Preferably, the composed microstructure comprises two zones with an anisotropic microstructure, which differ by the degree of anisotropy. It is further preferred that there are regions inside the area of a composed microstructure, which do not have a microstructure. Of course, any combination of the above preferred embodiments is possible.

Preferably, the desired surface microstructure, which is created in or on the target material using the structure describing data comprises a region with a surface microstructure which is optically effective and a region which provides optimum surface microstructures for alignment of liquid crystals.

The structure depth of the desired surface microstructure, which is created in or on the target material using the structure describing data may be the same as that of the original surface microstructure or may be different. Preferably, the structure depth of the desired surface microstructure is smaller than that of the original surface microstructure. More preferred is that the structure depth of the desired surface microstructure is larger than that of the original surface microstructure. Preferably, the structure depth of the desired surface microstructure is in the range from 10 nm to 100 μm, more preferred in the range from 30 nm to 10 μm and most preferred in the range from 50 nm to 1 μm.

Preferably, the desired surface microstructure has at least one area in which the microstructure fill factor is in the range from 0.050 to 0.95, more preferred in the range from 0.2 to 0.8 and most preferred in the range from 0.3 to 0.7.

Preferably, the desired surface microstructure comprises an area in which the average structure width, which when the surface microstructure is anisotropic is determined along the direction perpendicular to the anisotropy direction, is in the range from 10 nm to 1 mm, more preferred in the range from 50 nm to 100 μm and most preferred in the range from 100 nm to 10 μm. In case the desired surface microstructure is anisotropic, the desired surface microstructure preferably comprises an area in which the average structure width along the anisotropy direction is in the range from 50 nm to 5 mm, more preferred in the range from 200 nm to 200 μm and most preferred in the range from 500 nm to 50 μm.

Preferably, the desired surface microstructure comprises an area in which the average lateral structure distance, which when the surface microstructure is anisotropic is determined along the direction perpendicular to the anisotropy direction, is in the range from 10 nm to 1 mm, more preferred in the range from 50 nm to 100 μm and most preferred in the range from 100 nm to 10 μm. In case the desired surface microstructure is anisotropic, the desired surface microstructure preferably comprises an area in which the average lateral structure distance along the anisotropy direction is in the range from 50 nm to 5 mm, more preferred in the range from 200 nm to 200 μm and most preferred in the range from 500 nm to 50 μm.

Above methods of data processing allow to design very complex pattern of microstructures, even if the original surface microstructure is uniform and can be described by a single set of microstructure parameters. In particular, the same original surface microstructure can be used to design a plurality of composed microstructures. Thus, new microstructures, even with high complexity, can easily be designed on a computer, although the microstructure itself may be non-deterministic. Hence, methods known in the art, for example for generating anisotropic surface microstructures with a pattern of different anisotropy directions, such as those described in WO-01/29148 can be replaced by the methods of the invention. Composed microstructures as described above can, for example, be used to design and create surface microstructures which are optically effective in certain regions, for example they may provide light scattering properties, while other regions provide optimum surface microstructures for alignment of liquid crystals.

Surface microstructures created with the methods of the invention have a wide field of applications. For example, they may be used to provide security features in optical security elements, alignment layers for liquid crystals, anti-reflection surfaces, AR/VR applications, optical filters, light coupling, micro-optics, as well as for light management in many different technical areas.

BRIEF DESCRIPTION OF THE DRAWINGS

The invention is further illustrated by the accompanying drawing figures. It is emphasized that the various features are not necessarily drawn to scale.

FIG. 6*a* shows an enlarged microstructure, obtained by scaling the microstructure of FIG. 4 with the same scaling factor along the x- and y-direction.

FIG. 6*b* shows a reduced microstructure, obtained by scaling down the microstructure of FIG. 4 by the same factor in x- and y-direction.

FIG. 7*a* shows a microstructure as a result of anisotropic scaling of the microstructure of FIG. 4 by scaling up the microstructure along the y direction by a factor larger than 1.

FIG. 7*b* shows a microstructure as a result of anisotropic scaling of the microstructure of FIG. 4 by scaling up the microstructure along the x direction by a factor larger than 1.

DETAILED DESCRIPTION OF THE INVENTION

Figure 1:
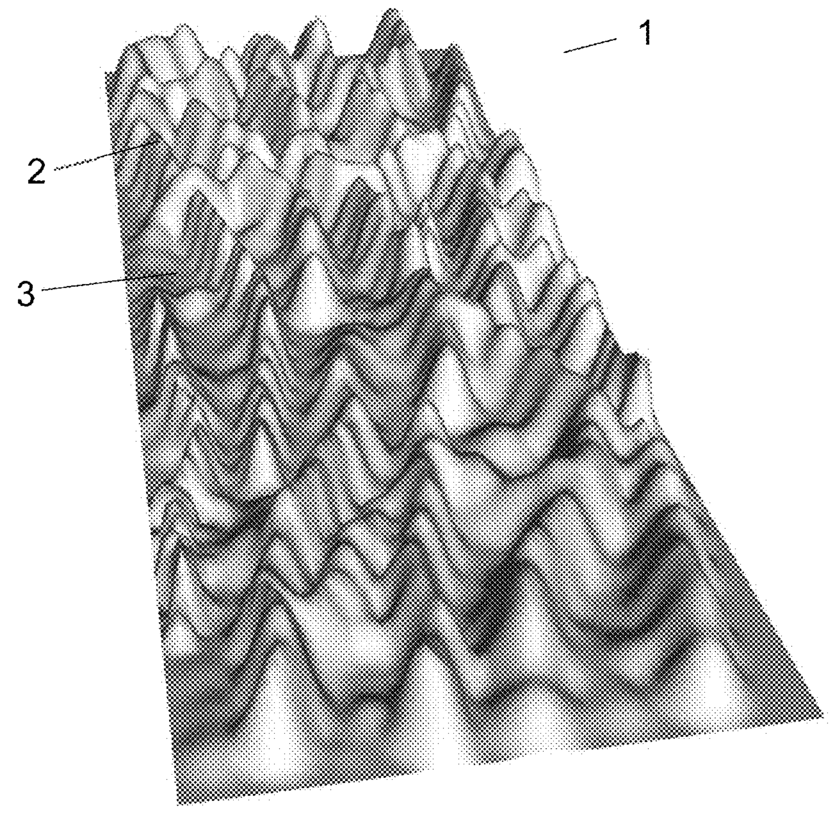
FIG. 1 shows a sketch of material with an anisotropic surface microstructure, which is considered as the original surface microstructure.

The methods of the invention are further explained by using the artificial surface microstructure 1 depicted in FIG. 1 as an original surface microstructure. The surface microstructure of FIG. 1 has been created for the purpose of illustration as a computer model, without using a computing algorithm. For the purpose of the explanation, the surface microstructure 1 can, therefore, be considered as non-deterministic. Further, the surface microstructure 1 is obviously anisotropic and non-periodic and comprises hills 2 of different heights and valleys 3, with a continuous transition from hills to valleys and vice versa.

Figure 2:
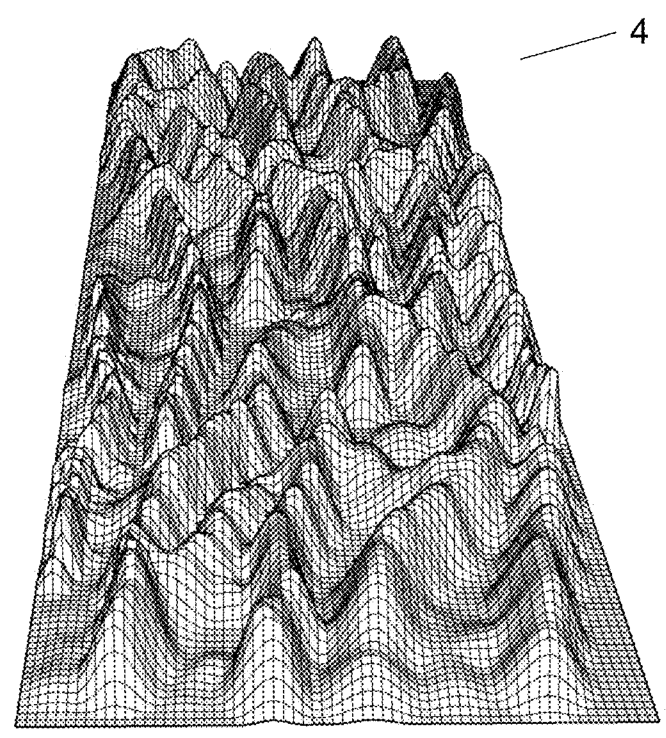
FIG. 2 shows a 3D-plot of simulated acquired digital data of the original surface microstructure topography of FIG. 1.

FIG. 2 illustrates the digital data 4, which would be acquired from the surface microstructure 1 of FIG. 1 by a 3D surface profilometer.

Once the digital data of the original surface microstructure are available, they can be processed by computer programs such as standard graphical image manipulation programs. In case it is desired to generate structure describing data for creating an analog surface microstructure in a target material using proper writing tools, manipulation of the digital data of the original surface microstructure may be in three dimensions. In addition to scaling the microstructure in lateral directions within the plane of the surface, the depth of the surface microstructure may be increased or reduced by scaling the data in the depth direction, which is the direction perpendicular to the surface plane.

On the other hand, if the writing tool can only transfer the lateral structure information, for example if binary lithographic processes are used, it is preferred to binarize the data of the surface microstructure. Accordingly, the structure describing data comprises only two height levels. This has the advantage that the boundaries of the microstructures are well defined and the lateral dimensions of the surface microstructure that will be created in the target material hardly depend on process conditions, such as exposure energies used in photo-lithography. The depth of the desired surface microstructure in the target material can be selected by adjusting the process parameters. It is also possible to create surface microstructures which have different depths in different areas, for example by using different process parameters in the respective areas, for example by sequential processing of the different areas.

Binarization can be done directly on the digital data of the original surface microstructure or it may be done after some data processing, such as lateral scaling. There are different ways to binarize the data of the surface microstructure along the depth direction. A straightforward way is to define a threshold height within the range of height values such that every height level above the threshold height is assigned to belong to the top level and every height level below the threshold height is assigned to belong to the bottom level of the binarized microstructure. Accordingly, the top and bottom regions are formed, respectively. Of course, it is possible to reverse the assignment as top and bottom levels if generation of a surface microstructure with an inverted topography is desired.

Figure 3A:
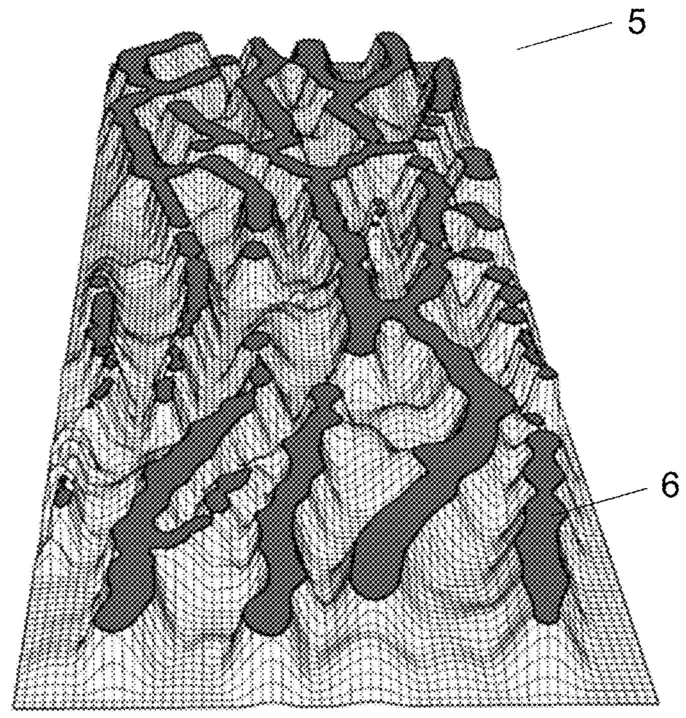
FIG. 3*a* shows the topography based on the same data as FIG. 2, wherein the top part is cut away at a certain height level, therefore the upper surface is a cross-section through the topography.
Figure 3B:
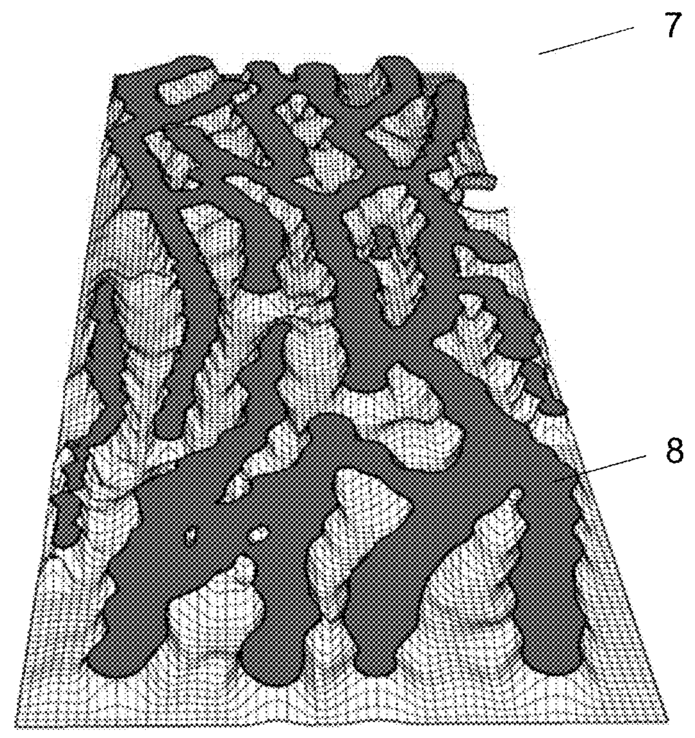
FIG. 3*b* shows a cross-section through the topography similar to FIG. 3*a*, but at a different height level.

Binarization by defining a threshold height as described above corresponds to a cross-section through the microstructure at a certain height. The height at which the cross-section is made typically has a strong influence on the shape of the binarized microstructure as well as on the microstructure fill factor. A first cross-section 5 of the surface microstructure 4 of FIG. 2 at a first height level is depicted in FIG. 3*a*. The regions 6 of the cross-section define the top regions of the corresponding binarized data. A second cross-section 7 at a lower threshold height is depicted in FIG. 3*b*. The total area of regions 8 of the second cross-section, which are assigned as top regions of the corresponding binarized data is significantly larger than in case of the first cross-section. On the one hand, the width of the individual top regions is broadened. On the other hand, there are additional distinct regions, which correspond to smaller hills of the original surface microstructure, which are assigned as bottom region in the first cross-section but are assigned as top region in the second cross-section. Accordingly, the microstructure fill factor of the binarized data obtained from the second cross-section is significantly larger than the microstructure fill factor of the binarized data obtained from the first cross-section. Processing of the digital data of the original micro-structure therefore allows to change the microstructure fill factor.

Preferably, there is at least one area within the micro-structure in which the microstructure fill factor of the binarized data is in the range from 0.050 to 0.95, more preferred in the range from 0.2 to 0.8 and most preferred in the range from 0.3 to 0.7.

Figure 4:
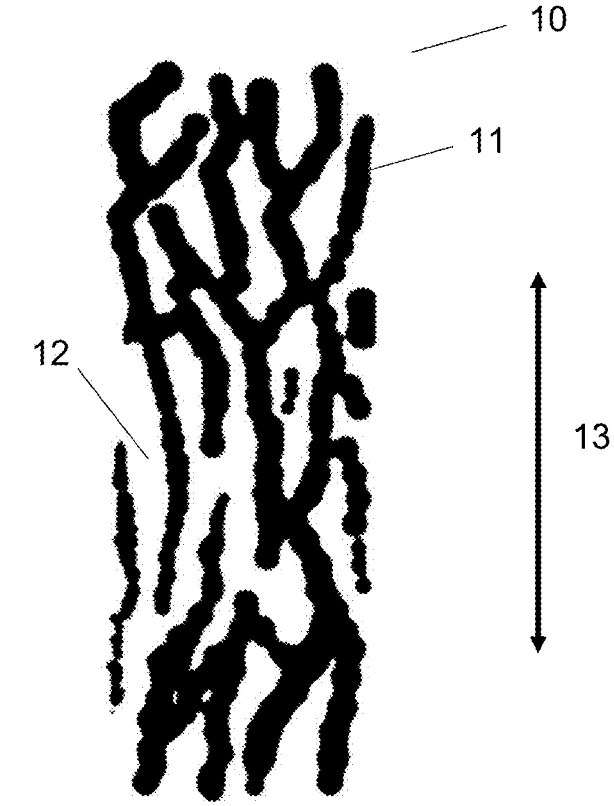
FIG. 4 shows a binarized microstructure of the topography of FIG. 2, corresponding to the cross-section of FIG. 3*b*.

FIG. 4 shows the binary microstructure 10, which results from binarization according to the cross-section of FIG. 3*b*, as descried above. The microstructure comprises top regions 11 and bottom regions 12. Obviously, the microstructure is anisotropic with an anisotropy direction approximately in vertical direction, as indicated by the arrow 13.

Figure 5:
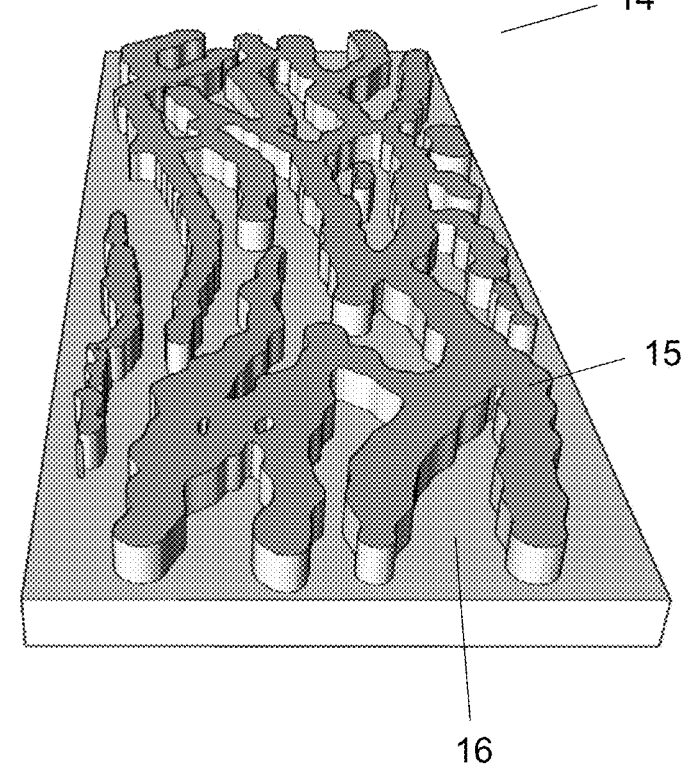
FIG. 5 shows a binary surface microstructure with two height levels, which was created in the target material by using the binarized data of FIG. 4.

FIG. 5 depicts a sketch of a desired surface microstructure 14, which is created by a method which includes writing with a writing tool a structure in or on the target material or in a resin using the structure describing data of FIG. 4. The surface microstructure 14 has only top regions 15 and bottom regions 16 and is therefore a binary surface micro-structure. The lateral dimensions of the surface microstructure 14 have not been changed compared to those of the microstructure of FIG. 4. The depth of the surface micro-structure 14 can be adjusted by the process conditions used for manufacturing.

The digital data of the surface microstructure can be laterally scaled up or down to change the lateral dimensions of the surface structure. Different scaling factors may be used in different lateral directions to achieve anisotropic scaling.

Figures 6A, 6B:
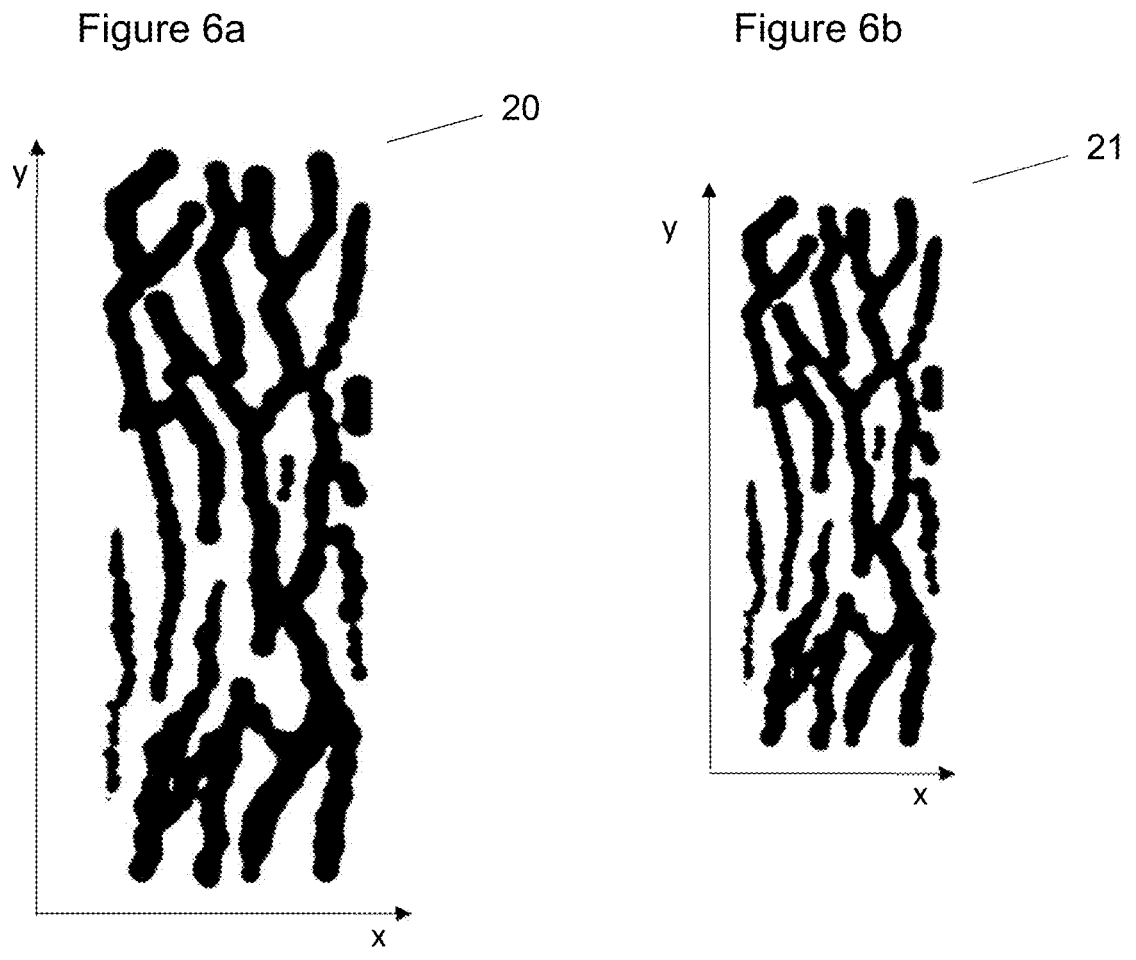

The microstructure 20 of FIG. 6*a* has been obtained by rescaling the microstructure 10 of FIG. 4 by the same factor larger than 1 along the x- and y-direction. While the area of top and bottom regions of the microstructure 20 is enlarged, the microstructure fill factor has not changed compared to that of the microstructure 10 of FIG. 4. Assuming that the surface microstructure 14 of FIG. 5, which has been created using a writing tool and the structure describing data of FIG. 4, would provide optimum light scattering properties for a certain wavelength range of light, then a surface microstruc-ture that would be created similarly but using the structure describing data of FIG. 6*a*, would provide optimum light scattering properties for a wavelength range of light that includes longer wavelengths than those of the certain wave-length range mentioned above. The scaling factor for enlarg-ing the lateral dimensions of original surface microstructure is typically larger than 1.1. Preferably, the scaling factor for enlarging the lateral dimensions of the original surface microstructure is larger than 1.5, more preferred larger than 2 and most preferred larger than 5.

The microstructure 21 of FIG. 6*b* has been obtained by rescaling the microstructure 10 of FIG. 4 by the same factor smaller than 1 along the x- and y-direction. While the area of top and bottom regions of the microstructure 21 are reduced, the microstructure fill factor has not changed compared to that of the microstructure 10 of FIG. 4. Assum-ing that the surface microstructure 14 of FIG. 5, which has been created using a writing tool and the structure describing data of FIG. 4, would provide optimum light scattering properties for a certain wavelength range of light, then a surface microstructure that would be created similarly but using the structure describing data of FIG. 6*b*, would pro-vide optimum light scattering properties for a wavelength range of light that includes shorter wavelengths than those of the certain wavelength range mentioned above. The scaling factor for downsizing the lateral dimensions of original surface microstructure is typically less than 0.95. Preferably, the scaling factor for downsizing the lateral dimensions of the original surface microstructure is less than 0.8, more preferred less than 0.5 and most preferred less than 0.2.

Figures 7A, 7B:
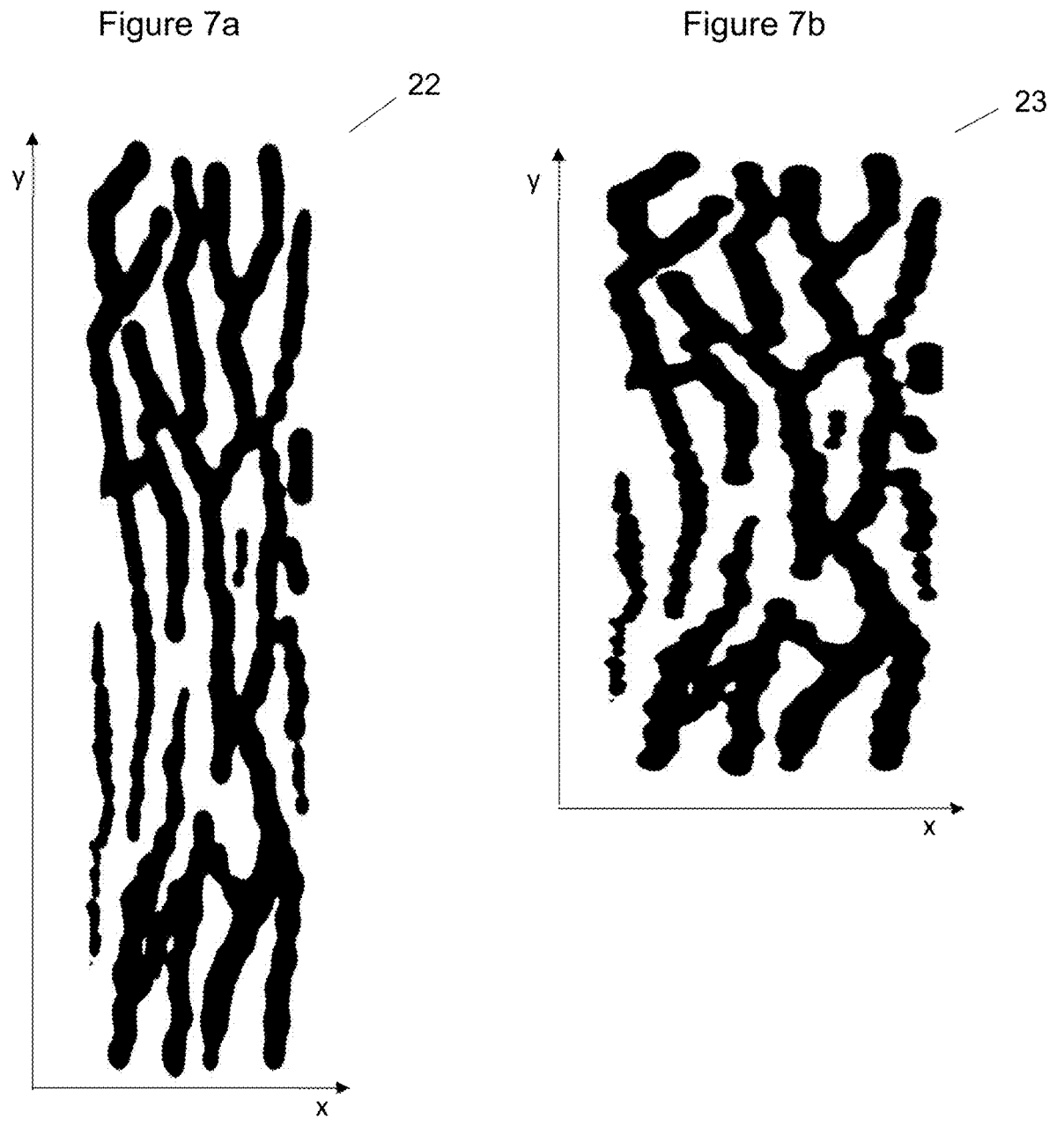

The microstructure 22 of FIG. 7*a* has been obtained by anisotropic scaling of the microstructure 10 of FIG. 4 along the anisotropy direction y by a factor of 1.5. This corre-sponds to stretching the microstructure and has the effect that the anisotropy of the microstructure is increased. In a surface microstructure designed for light scattering, the anisotropy of the spatial distribution of scattered light increases if the anisotropy of the microstructure is increased. Further, in a surface microstructure designed as alignment layer for liquid crystals, the alignment force and alignment quality increases with increased anisotropy of the micro-structure. Alternatively to the example of microstructure 22, it is preferred to also scale the microstructure along the axis perpendicular to the anisotropy axis, which is the x-direc-tion, by a factor less or larger than 1. Anisotropic scaling can also be applied to an isotropic microstructure. Preferably, the scaling factor along a first direction is more than 1.1, more preferred more than 1.5 and most preferred more than 2 times higher than the scaling factor along a second direction, wherein no scaling in a certain direction means the scaling factor is 1 along the respective direction. Preferably, the second direction is perpendicular to the first direction. Preferably, the first direction is parallel to the anisotropy direction.

The microstructure 23 of FIG. 7*b* has been obtained by anisotropic scaling of the microstructure 10 of FIG. 4 along the direction perpendicular to the anisotropy direction by a factor of 1.5. This has the effect that the anisotropy of the microstructure is decreased. For a surface microstructure designed for light scattering, the anisotropy of the spatial distribution of scattered light decreases if the anisotropy of the microstructure is decreased. By anisotropic scaling of a microstructure it is therefore possible to tailor the spatial distribution of light scattering. Preferably, the scaling factor along a direction perpendicular to the anisotropy direction is more than 1.1, more preferred more than 1.5 and most preferred more than 2 times higher than the scaling factor along the anisotropy direction, wherein no scaling in a certain direction means the scaling factor is 1 along the respective direction.

Figures 8A, 8B:
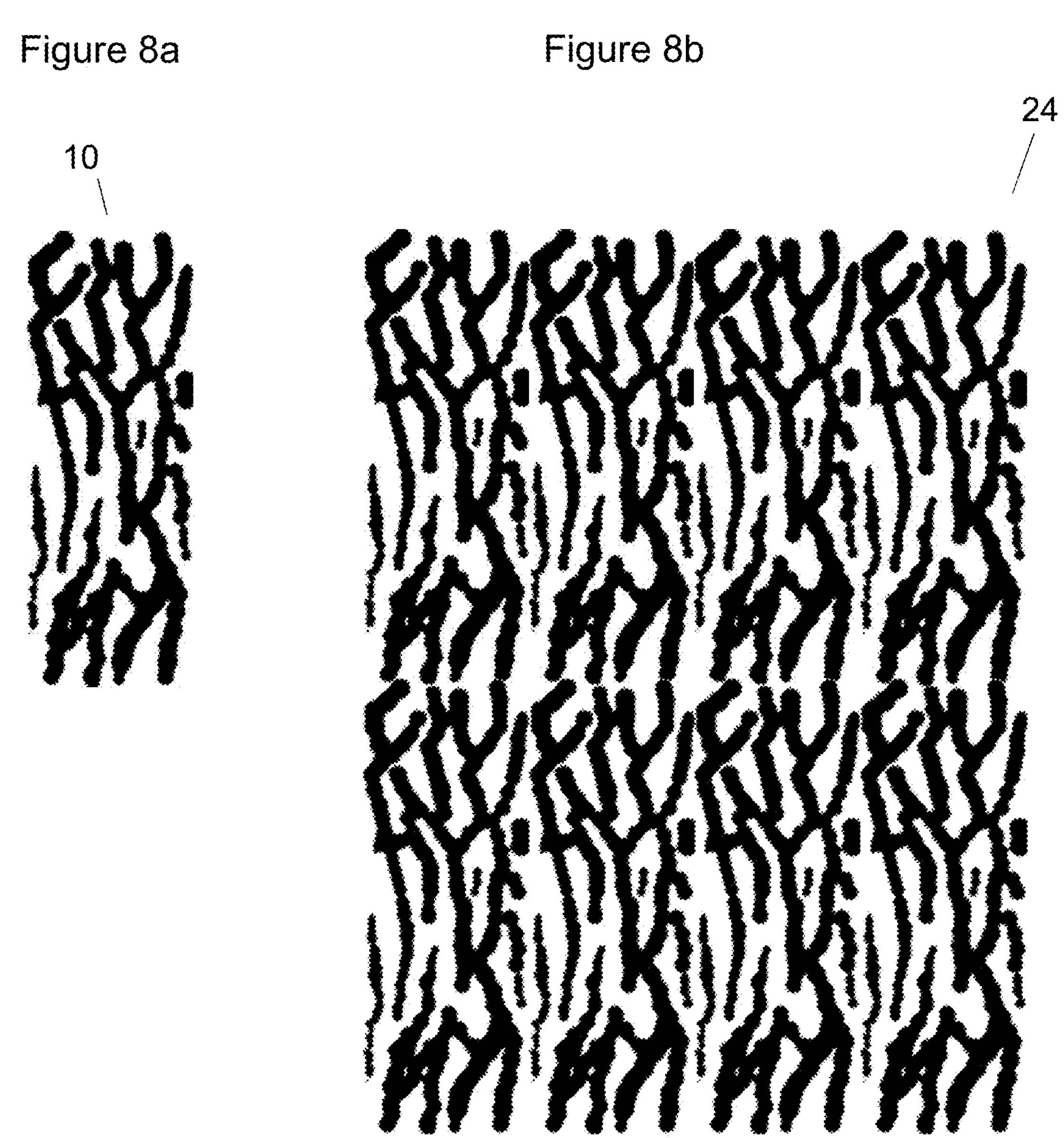
FIG. 8*a* shows the microstructure 10 of FIG. 4, depicted with a different reproduction scale.
FIG. 8*b* shows a composed microstructure as a result of arranging the basic microstructure element of FIG. 8*a* multiple times along the x- and y-directions.

FIG. 8 shows an example of a composed microstructure. FIG. 8*a* shows the microstructure 10 of FIG. 4, depicted with a different reproduction scale, which is selected as a basic microstructure element. FIG. 8*b* shows the composed microstructure 24, which results from arranging the basic microstructure element 10 eight times in a matrix of two rows and four columns. Accordingly, the area of the micro-structure 24 is 8 times larger than that of the microstructure 10. Preferably, a composed microstructure comprises two or more basic microstructure elements, more preferred 5 or more basic microstructure elements and most preferred ten or more basic microstructure elements.

The basic microstructure element can be easily identified in the composed microstructure 24 of FIG. 8*b*, because of its regular arrangement. The regular arrangement may create a superposition of the non-deterministic microstructure of the basic microstructure elements and the periodic structure generated by the regular arranged of the basic microstructure elements. If the desired microstructure manufactured using the data of microstructure 24 is used for light scattering applications, the spatial distribution of light scattered at such a surface microstructure is correspondingly a superposition of light with a smooth angular intensity variation caused by scattering at the non-deterministic microstructure part and characteristic angular light intensity maxima, caused by scattering at the regular arrangement of the basic microstructure elements. This effect may be desired for some applications, but it may also be undesired.

Figure 9:
FIG. 9 shows a composed microstructure, which is also based on the basic microstructure element of FIG. 8*a*, but a different algorithm for arrangement than for FIG. 8*b* has been applied.

By using more sophisticated algorithms to compose a microstructure by arranging a basic microstructure element multiple times, the effect of a regular arrangement can be avoided. FIG. 9 shows a microstructure 25 which is also composed of the basic microstructure element of FIG. 8*a*. However, the copies of the basic microstructure element are arranged with a slight overlap which results in a kind of morphing of the overlapping microstructure elements. In addition, the copies of the basic microstructure element are positioned with a vertical shift in the second and fourth column. The image of the resulting microstructure 25 of FIG. 9 is cropped at the bottom and at the top to obtain the shape as depicted in FIG. 9. The regular pattern observable in FIG. 8*b* can no longer be observed in FIG. 9. By further randomizing the position of the copies of the basic microstructure element, any periodicity that may be induced by the multiple arrangement of the basic microstructure element can be avoided.

Figure 10:
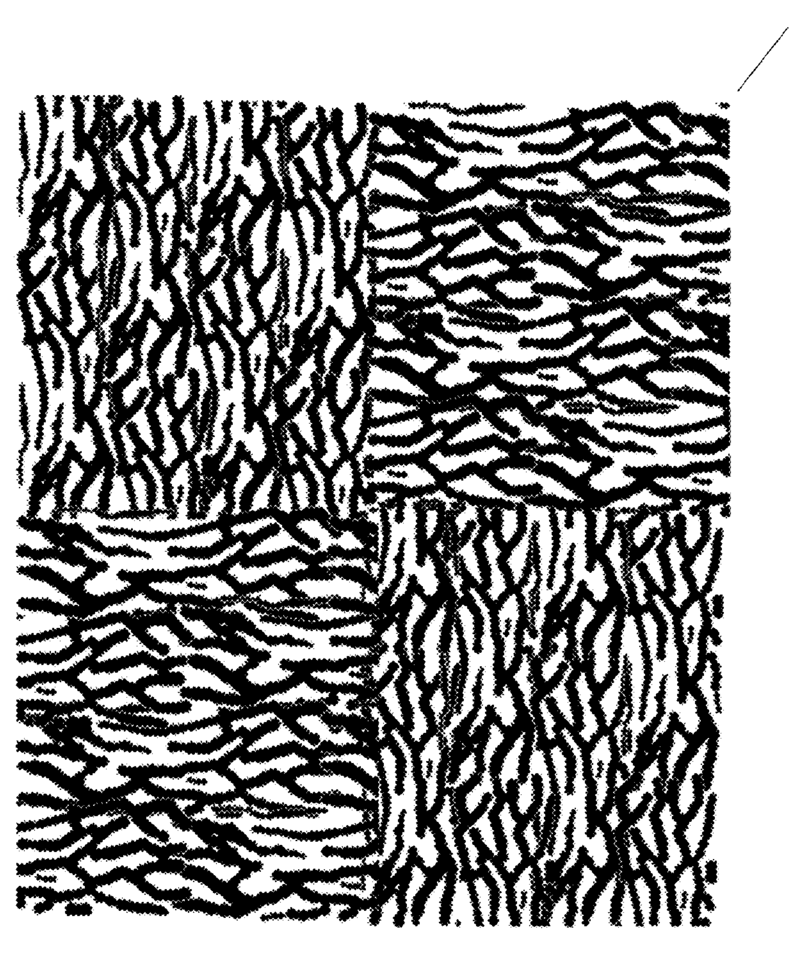
FIG. 10 shows a composed microstructure for which a part of the composed microstructure of FIG. 9 has been defined as a basic microstructure element, which has then been arranged two times along the x-direction and two times along the y-direction, wherein at two positions the basic microstructure element was rotated by 90°.

FIG. 10 shows an example, in which part of the composed microstructure 25 of FIG. 9 is used as a basic microstructure element. A new composed microstructure 26 is created by arranging the basic microstructure element two times along the x-direction and two times along the y-direction, wherein at two positions the basic microstructure element is rotated by 90°. Preferably, the composed microstructure has zones with different anisotropy directions and comprises preferably two, three, four, five or more different anisotropy directions.

Figure 11:
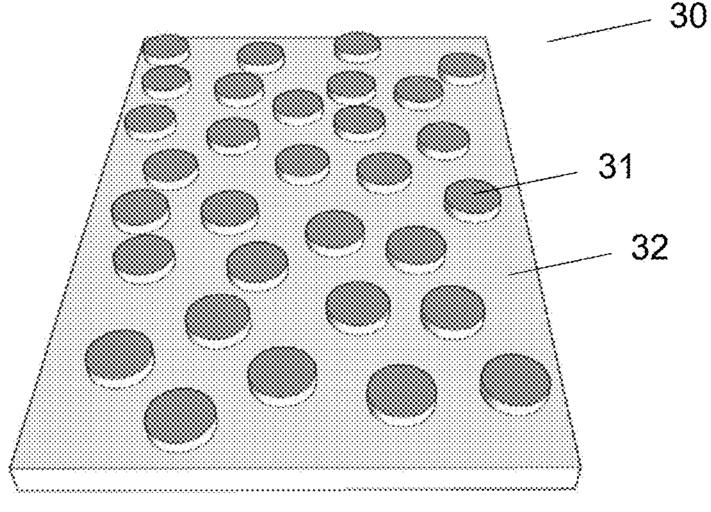
FIG. 11 shows a sketch of a material with an isotropic surface microstructure, which is considered as the original surface microstructure.
Figure 12:
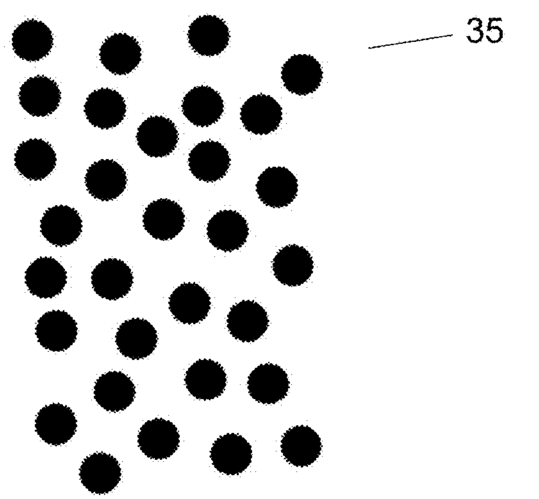
FIG. 12 shows a binarized microstructure of the topography of FIG. 11.

FIG. 11 shows an example of an isotropic surface microstructure 30 that was created with a digital illustration computer program. The surface microstructure 30 comprises isotropic lands 31 of identical height, randomly distributed on the bottom level 32 of the surface. Because the surface microstructure has only two height levels, the binarized microstructure 35 of FIG. 12 that is obtained form a cross-section through the lands 31 is independent from the height at which the cross-section is made.

Figure 13:
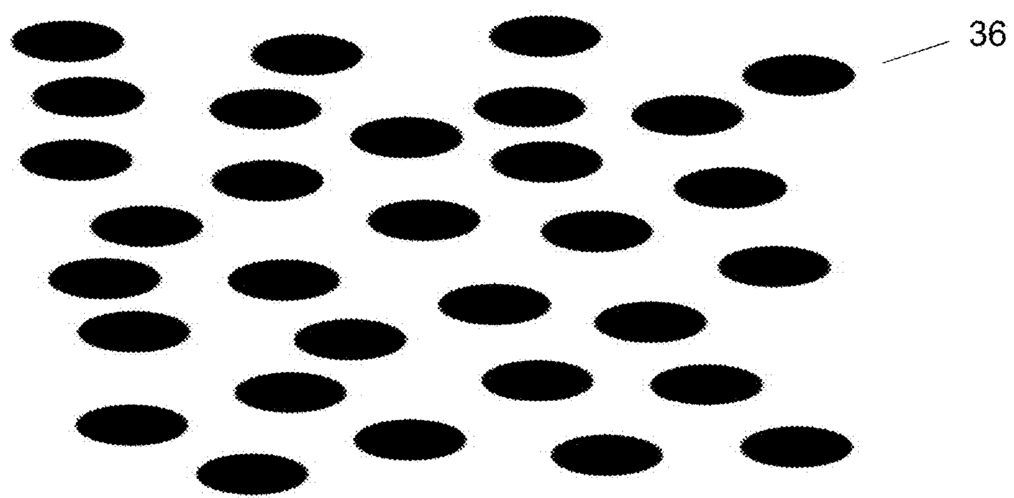
FIG. 13 shows an anisotropic microstructure as a result of scaling the isotropic microstructure of FIG. 12 along the horizontal direction by a factor larger than 1.

FIG. 13 shows an anisotropic microstructure 36 as a result of anisotropic scaling of the isotropic microstructure 35 by using a scaling factor larger than 1 along the horizontal direction and no rescaling along the vertical direction.

Preferred surface microstructures to be used as original surface microstructures are generated by a method known as monomer corrugation (MC) technology that uses phase-separation and crosslinking of a mixture of crosslinkable and non-crosslinkable substances, as disclosed in international patent application WO 01/29148 A1, the content of which is incorporated hereby by reference. According to the method, a material composition comprising crosslinkable and non-crosslinkable substances is applied as a layer on a substrate. Upon irradiation of the layer with uv-light, the crosslinkable substances begin to crosslink, and phase separation of crosslinked and non-cross-linked substances starts to develop. By removal of the non-crosslinked substances, for example by washing in an appropriate solvent, an MC-layer exhibiting a surface microstructure is obtained. The dimensions of the surface microstructure can be controlled by the type of substances and by the percentages of the respective substances in the composition as well as by process parameters such as temperature, uv-dose and process duration. The surface microstructure may be isotropic or anisotropic. Anisotropic surface microstructures can be achieved if the crosslinkable material in the composition is a liquid crystalline substance. The anisotropy direction can be defined by an alignment layer beneath a layer formed from the composition. By using an alignment layer providing an orientation pattern, a pattern with different anisotropy directions may be generated in the MC-layer. MC-layers can, for example, be applied as alignment layers for liquid crystals, optical retardation layers, anti-reflective coatings, and optical diffusers.

Preferred surface microstructures with a binarized surface depth profile to be used as original surface microstructures are generated by a method disclosed in WO 2010/094441 A1, the content of which is incorporated hereby by reference. The method is based on the above-mentioned MC technology but modifies the depth profile of the surface microstructures of WO 01/29148 A1 by additional etching steps such that a surface microstructure results that has only two height levels. Accordingly, the surface microstructure has only top regions and bottom regions, each at a certain height level.

In a preferred embodiment of the present invention the original surface microstructure comprises at least one area in which the microstructure is non-periodic. Preferably, the original surface microstructure comprises at least one area in which the microstructure is non-deterministic.

A helpful parameter to characterize non-periodic or non-deterministic surface microstructure profiles is the autocorrelation function and a related autocorrelation length. The one-dimensional or two-dimensional autocorrelation function of a surface microstructure profile can be understood as a measure for the predictability of the surface microstructure profile for two spatially separated points by a distance x in the plane.

The autocorrelation function AC(x) of a function P(x), such as the surface microstructure profile, is defined as $$AC(x) = \int P(x') \cdot P(x' + x) \cdot dx'.$$

More details on the autocorrelation function and corresponding programming issues can be found e.g. in "Numerical recipes in C: the art of scientific computing/William H. Press; Saul A. Teukolsky; William T. Vetterling; Brian P. Flannery.—Cambridge; New York: Cambridge University Press, 1992".

For a non-periodic or non-deterministic surface microstructure profile, the autocorrelation function decays rapidly with increasing x. On the other hand, for a deterministic surface microstructure profile found for instance in a grating, the autocorrelation does not decay. In the case of the grating the autocorrelation function is however modulated with a periodic function.

In the following, AC(x) shall represent an averaged one-dimensional autocorrelation function. From the averaged one-dimensional autocorrelation function, a single characteristic number, an autocorrelation length L, can be determined. For this purpose, an envelope of the averaged autocorrelation function is constructed by connecting the relevant local maxima of AC(x) with straight lines. If there is no relevant local maximum of AC(x) for $x>0$, the envelope shall be identical to the averaged autocorrelation function. Further, if there is no relevant local maximum with $AC(x) \leq AC(0)/10$, then the values of the envelope for $AC(x) \leq AC(0)/10$ shall be equal to AC(x). The autocorrelation length L is determined as the value of x for which the envelope of the averaged autocorrelation function finally decays below 10% of AC(0).

The term relevant local maximum is used to exclude minor local maxima from consideration, which are, for example, caused by noise. To decide whether a local maximum $AC_m(x_m)$ is a relevant local maximum, the largest value $x_{m-1}<x_m$ is determined for which $AC(x)\geq AC_m(x_m)$ and the difference between the value of $AC_m(x_m)$ and the lowest value of AC(x) in the range from $x_{m-1}$ to $x_m$ is calculated as $AC_m$diff1. Similarly, the lowest value $x_{m+1}>x_m$ for which $AC(x)\geq AC_m(x_m)$ is determined and the difference between the value of $AC_m(x_m)$ and the lowest value of AC(x) in the range from $x_m$ to $x_{m+1}$ is calculated as $AC_m$diff2. The difference $AC_m$diff is then equal to the lower of $AC_m$diff1 and $AC_m$diff2. In case $x_{m+1}$ does not exist, $AC_m$diff shall be equal to $AC_m$diff1. A local maximum $AC_m(x_m)$ shall be considered as a relevant local maximum if $AC_m$diff is larger than 0.5% of AC(0).

Preferably, an original surface microstructure comprises at least one region with a surface microstructure, which in at least one direction has an averaged one-dimensional autocorrelation function AC(x) with an autocorrelation length smaller than three times an average lateral structure distance. For anisotropic surface modulations the one direction is perpendicular to the anisotropy direction.

More preferred are original surface microstructures, wherein the autocorrelation length is smaller than two times an average lateral structure distance. Even more preferred are original surface microstructures, wherein the autocorrelation length is smaller than one average lateral structure distance.

In another preferred embodiment, the autocorrelation length L is greater than one hundredth average lateral structure distance.

To describe anisotropic surface microstructures the term surface microstructure aspect ratio (SMAR) is defined for the context of this invention as the average length to width ratio of top and bottom regions of the surface microstructures. The SMAR strongly determines the azimuthal optical appearance of light scattered at the surface microstructure or the alignment strength in case the surface microstructure is used as alignment layer for liquid crystals, respectively. For SMAR=1, which corresponds to surface microstructures which exhibit in average the same extension in at least two lateral directions, the scattering properties for incident light is almost independent on the azimuthal incident angle of the light and if used as an alignment layer, a preferred direction for the alignment of liquid crystals is not defined. Therefore, the intensity of light reflected from a surface microstructure with SMAR=1 does hardly change when the element containing the surface microstructure is rotated along an axis perpendicular to the surface of the element.

For anisotropic desired surface microstructures intended to be used as light scattering surface, the intensity of scattered light depends on the azimuthal incidence angle of the light. To be able to visually recognize this dependency, SMAR of the desired surface microstructures is preferably larger than 1.1, more preferred larger than 2 and most preferred larger than 5. For very large SMAR values the range of azimuthal angles into which a significant amount of light is scattered becomes smaller, which makes it more difficult to visually observe the reflected light, for example if used in an optical security device. Therefore, preferably, there is at least one area in the desired surface microstructure, in which the SMAR is less than 50, more preferred less than 20 and most preferred less than 10. Preferably, the SMAR is in the range from 1.1 to 50, more preferred, the SMAR is in the range from 2 to 20.

The invention and different embodiments can be summarized by the following items:

1. Method for creation of a desired surface microstructure, the method comprising the steps
   providing a material with a surface microstructure which has a topography, the surface microstructure being considered as the original surface microstructure;
   providing a 3D surface profilometer;
   acquiring digital data of the original surface microstructure topography with the 3D surface profilometer;
   providing a writing tool;
   processing the digital data of the original surface microstructure topography to obtain structure describing data to be written by the writing tool;
   providing the structure describing data for a desired surface microstructure to the writing tool;
   providing a target material;
   optionally providing a resin;
   creating the desired surface microstructure in or on the target material comprising writing with the writing tool a structure in or on the target material or in a resin using the structure describing data.
2. The method according to item 1, wherein the original surface microstructure comprises an area in which the average structure width, which when the surface microstructure is anisotropic is determined along the direction perpendicular to the anisotropy direction, is in the range from 10 nm to 1 mm, more preferred in the range from 50 nm to 100 μm and most preferred in the range from 100 nm to 10 μm.
3. The method according to any preceding item, wherein the original surface microstructure comprises an area in which the average lateral structure distance, which when the surface microstructure is anisotropic is determined along the direction perpendicular to the anisotropy direction, is in the range from 10 nm to 1 mm, more preferred in the range from 50 nm to 100 μm and most preferred in the range from 100 nm to 10 μm.
4. The method according to any preceding item, wherein the original surface microstructure has at least one area in which the microstructure fill factor is in the range from 0.050 to 0.95, more preferred in the range from 0.2 to 0.8 and most preferred in the range from 0.3 to 0.7.
5. The method according to any preceding item, wherein the structure depth of the original surface microstructure is in the range from 10 nm to 100 μm, more preferred in the range from 30 nm to 10 μm and most preferred in the range from 50 nm to 2 μm.
6. The method according to any preceding item, wherein the original surface microstructure has at least one area in which the microstructure is anisotropic.
7. The method according to any preceding item, wherein the original surface microstructure has at least one area in which the microstructure is non-periodic.
8. The method according to any preceding item, wherein the original surface microstructure has been made by a method including the steps
   providing a substrate;
   providing a material composition comprising crosslinkable and non-crosslinkable substances;
   forming a layer of the material composition on the substrate;

initiating crosslinking of the cross-linkable substances by irradiation with uv-light;

removing the non-crosslinked substances.

9. The method according to any preceding item, wherein processing the digital data of the original surface microstructure includes lateral scaling of the microstructure within the plane of the microstructure.

10. The method according to item 9, wherein different scaling factors in different lateral directions are applied, preferably in two different directions, which are perpendicular to each other.

11. The method according to any preceding item, wherein processing the digital data of the original surface microstructure includes binarization of the digital data.

12. The method according to any preceding item, wherein processing the digital data of the original surface microstructure includes creation of a composed microstructure by arranging two basic microstructure elements, which differ by the average lateral structure distance of the microstructure and/or which differ by the average structure width of the microstructure and/or which differ by the microstructure fill factor of the microstructure and/or which differ by the anisotropy direction of the microstructure and/or which differ by the degree of anisotropy and/or wherein one basic microstructure element comprises a periodic microstructure and the other basic microstructure element comprises a non-periodic microstructure.

13. The method according to any preceding item, wherein the desired surface microstructure comprises a region with a surface microstructure which is optically effective and a region which provides optimum surface microstructures for alignment of liquid crystals.

14. The method according to any preceding item, wherein the structure depth of the desired surface microstructure is larger than that of the original surface microstructure.

15. The method according to any preceding item, wherein surface microstructure aspect ratio (SMAR) of the desired surface microstructures is preferably larger than 1.1, more preferred larger than 2 and most preferred larger than 5.

The invention claimed is:

1. A method for creation of a desired surface microstructure, the method comprising the steps of:

providing a material with a surface microstructure which has a topography, the surface microstructure being considered as the original surface microstructure, wherein the structure depth of the original surface microstructure is in the range from 10 nm to 100 μm;

providing a 3D surface profilometer;

acquiring digital data of the original surface microstructure topography with the 3D surface profilometer;

providing a writing tool;

processing the digital data of the original surface microstructure topography to obtain structure describing data to be written by the writing tool;

providing the structure describing data for the desired surface microstructure to the writing tool;

providing a target material;

optionally providing a resin;

creating the desired surface microstructure in or on the target material comprising writing with the writing tool a structure in or on the target material or in the resin using the structure describing data.

2. The method according to claim 1, wherein the original surface microstructure comprises an area in which the average structure width, which when the surface microstructure is anisotropic is determined along the direction perpendicular to the anisotropy direction, is in the range from 10 nm to 1 mm.

3. The method according to claim 1, wherein the original surface microstructure comprises an area in which the average lateral structure distance, which when the surface microstructure is anisotropic is determined along the direction perpendicular to the anisotropy direction, is in the range from 10 nm to 1 mm.

4. The method according to claim 1, wherein the original surface microstructure has at least one area in which the microstructure fill factor is in the range from 0.050 to 0.95.

5. The method according to claim 1, wherein the structure depth of the original surface microstructure is in the range from 30 nm to 10 μm.

6. The method according to claim 1, wherein the original surface microstructure has at least one area in which the microstructure is anisotropic.

7. The method according to claim 1, wherein the original surface microstructure has at least one area in which the microstructure is non-periodic.

8. The method according to claim 1, wherein the original surface microstructure has been made by a method including the steps of:

providing a substrate;

providing a material composition comprising crosslinkable and non-crosslinkable substances;

forming a layer of the material composition on the substrate;

initiating crosslinking of the cross-linkable substances by irradiation with uv-light;

removing the non-crosslinked substances.

9. The method according to claim 1, wherein processing the digital data of the original surface microstructure includes lateral scaling of the microstructure within the plane of the microstructure.

10. The method according to claim 9, wherein different scaling factors in different lateral directions are applied.

11. The method according to claim 1, wherein processing the digital data of the original surface microstructure includes binarization of the digital data.

12. The method according to claim 1, wherein processing the digital data of the original surface microstructure includes creation of a composed microstructure by arranging two basic microstructure elements, which differ by the average lateral structure distance of the microstructure and/or which differ by the average structure width of the microstructure and/or which differ by the microstructure fill factor of the microstructure and/or which differ by the anisotropy direction of the microstructure and/or which differ by the degree of anisotropy and/or wherein one basic microstructure element comprises a periodic microstructure and the other basic microstructure element comprises a non-periodic microstructure.

13. The method according to claim 1, wherein the desired surface microstructure comprises a region with a surface microstructure which is optically effective and a region which provides optimum surface microstructures for alignment of liquid crystals.

14. The method according to claim 1, wherein the structure depth of the desired surface microstructure is larger than that of the original surface microstructure.

15. The method according to claim 1, wherein surface microstructure aspect ratio (SMAR) of the desired surface microstructures is larger than 1.1.

16. The method according to claim 1, wherein the original surface microstructure comprises an area in which the average structure width, which when the surface microstructure is anisotropic is determined along the direction perpendicular to the anisotropy direction, is in the range from 50 nm to 100 μm.

17. The method according to claim 1, wherein the original surface microstructure comprises an area in which the average structure width, which when the surface microstructure is anisotropic is determined along the direction perpendicular to the anisotropy direction, is in the range from 100 nm to 10 μm.

18. The method according to claim 1, wherein the original surface microstructure comprises an area in which the average lateral structure distance, which when the surface microstructure is anisotropic is determined along the direction perpendicular to the anisotropy direction, is in the range from 50 nm to 100 μm.

19. The method according to claim 1, wherein the original surface microstructure comprises an area in which the average lateral structure distance, which when the surface microstructure is anisotropic is determined along the direction perpendicular to the anisotropy direction, is in the range from 100 nm to 10 μm.

20. The method according to claim 1, wherein the original surface microstructure has at least one area in which the microstructure fill factor is i in the range from 0.2 to 0.8.

21. The method according to claim 1, wherein the original surface microstructure has at least one area in which the microstructure fill factor is in the range from 0.3 to 0.7.

22. The method according to claim 1, wherein the structure depth of the original surface microstructure is in the range from 50 nm to 2 μm.

23. The method according to claim 9, wherein different scaling factors in different lateral directions are applied in two different directions which are perpendicular to each other.

24. The method according to claim 1, wherein surface microstructure aspect ratio (SMAR) of the desired surface microstructures is larger than 2.

25. The method according to claim 1, wherein surface microstructure aspect ratio (SMAR) of the desired surface microstructures is larger than 5.

* * * * *